(12) United States Patent
Azenkot et al.

(10) Patent No.: US 7,825,740 B2
(45) Date of Patent: Nov. 2, 2010

(54) SYSTEMS AND METHODS FOR TRACKING COMMUNICATION PARAMETERS OVER A PLURALITY OF FREQUENCY BANDS

(75) Inventors: Yehuda Azenkot, San Jose, TX (US); Michael E. Wilhoyte, Santa Rosa, CA (US); Manoneet Singh, Philadelphia, PA (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 12/260,273

(22) Filed: Oct. 29, 2008

(65) Prior Publication Data

US 2010/0102889 A1    Apr. 29, 2010

(51) Int. Cl.
*H03L 7/093* (2006.01)
*H03L 7/07* (2006.01)

(52) U.S. Cl. .......................... 331/25; 331/179; 455/260; 375/376

(58) Field of Classification Search .................... 331/25, 331/179; 455/260; 375/376
See application file for complete search history.

(56) References Cited

U.S. PATENT DOCUMENTS

| 2006/0234656 A1 | 10/2006 | Matsui et al. |
| 2007/0053462 A1* | 3/2007 | Pirooz et al. ................. 375/285 |
| 2007/0085623 A1 | 4/2007 | Staszewski et al. |
| 2008/0291974 A1* | 11/2008 | Collados et al. ............. 375/130 |

* cited by examiner

*Primary Examiner*—Robert Pascal
*Assistant Examiner*—James E Goodley
(74) *Attorney, Agent, or Firm*—Steven A. Shaw; W. James Brady; Frederick J. Telecky, Jr.

(57) ABSTRACT

In at least some embodiments, a communication system includes a receiver having a local oscillator (LO) for each of a plurality of frequency bands. Each LO is controlled by a separate phase-locked loop (PLL) that tracks carrier frequency offset (CFO) using a common phase error (CPE). The CPE is selectively weighted based on at least one inter-band frequency correlation (IFC) coefficient.

19 Claims, 6 Drawing Sheets

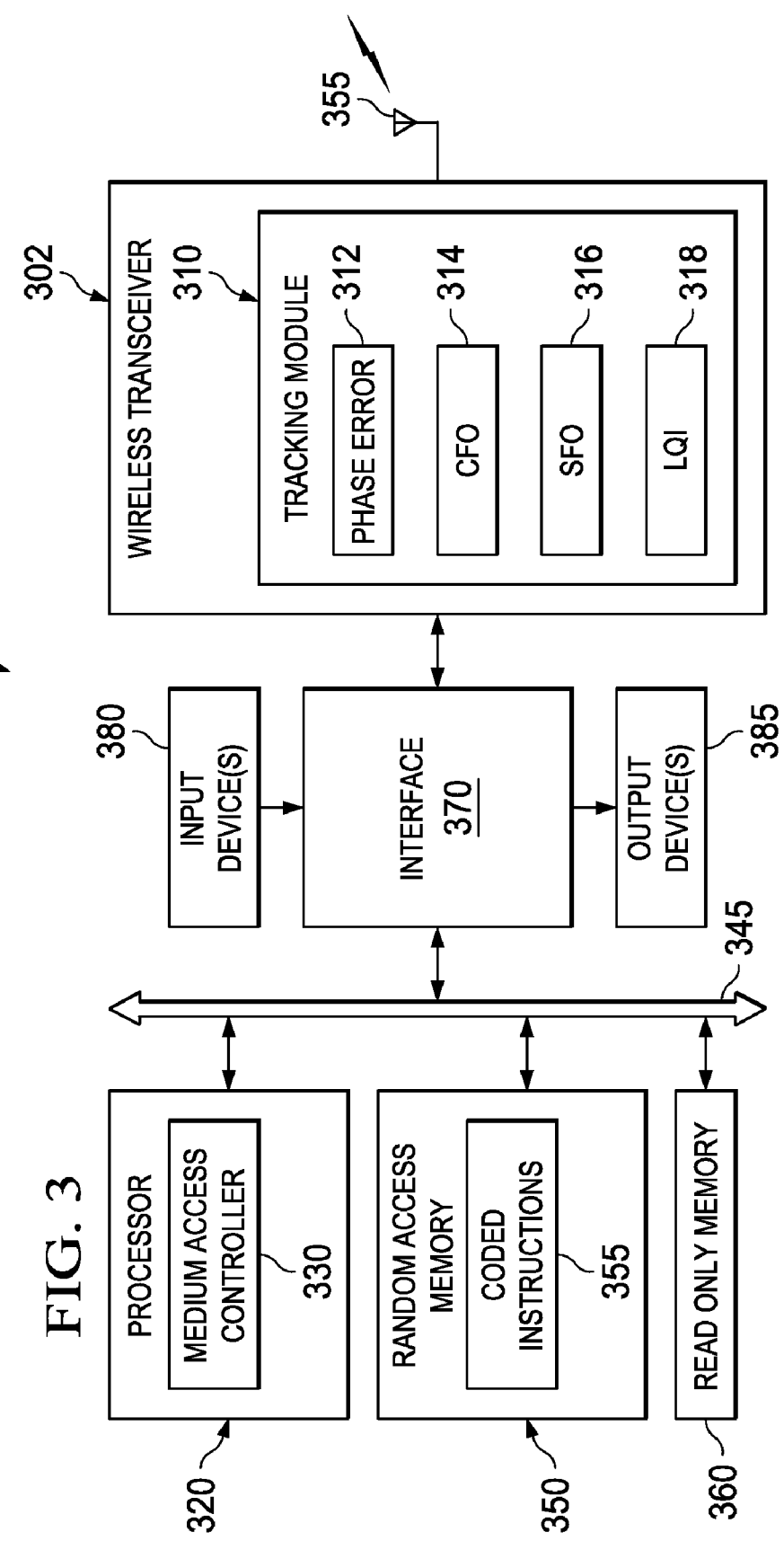

SYSTEMS AND METHODS FOR TRACKING COMMUNICATION PARAMETERS OVER A PLURALITY OF FREQUENCY BANDS

BACKGROUND

Some wireless technologies employ multiple frequency bands for communications. For such technologies, frequency hopping may be used to reduce interference. The receiver for a frequency hopping signal (e.g., an Ultra-Wideband (UWB) receiver) may employ multiple phase-locked loops (PLLs) for each frequency band. For example, if three PLLs are employed for each frequency band, each PLL may handle approximately one-third of the symbols. In general, employing multiple PLLs leads to longer phase and frequency acquisition times and to noise sensitivity.

SUMMARY

In at least some embodiments, a communication system comprises a receiver having a local oscillator (LO) for each of a plurality of frequency bands. Each LO is controlled by a separate phase-locked loop (PLL) that tracks carrier frequency offset (CFO) using a common phase error (CPE). The CPE is selectively weighted based on at least one inter-band frequency correlation (IFC) coefficient.

In at least some embodiments, a method comprises tracking a carrier frequency offset (CFO) based on a common phase error (CPE) for each of a plurality of frequency bands. The method further comprises selectively weighting the CPE based on at least one inter-band frequency correlation (IFC) coefficient.

In at least some embodiments, an Ultra-Wideband (UWB) network comprises a first device and a second device. At least one of the first and second devices implements selectively correlated phase-locked loops (PLLs) to track a carrier frequency offset (CFO) over a plurality of frequency bands.

BRIEF DESCRIPTION OF THE DRAWINGS

For a detailed description of illustrative embodiments of the invention, reference will now be made to the accompanying drawings in which:

FIG. 3 illustrates a computer system in accordance with embodiments;

NOTATION AND NOMENCLATURE

Figure 1:
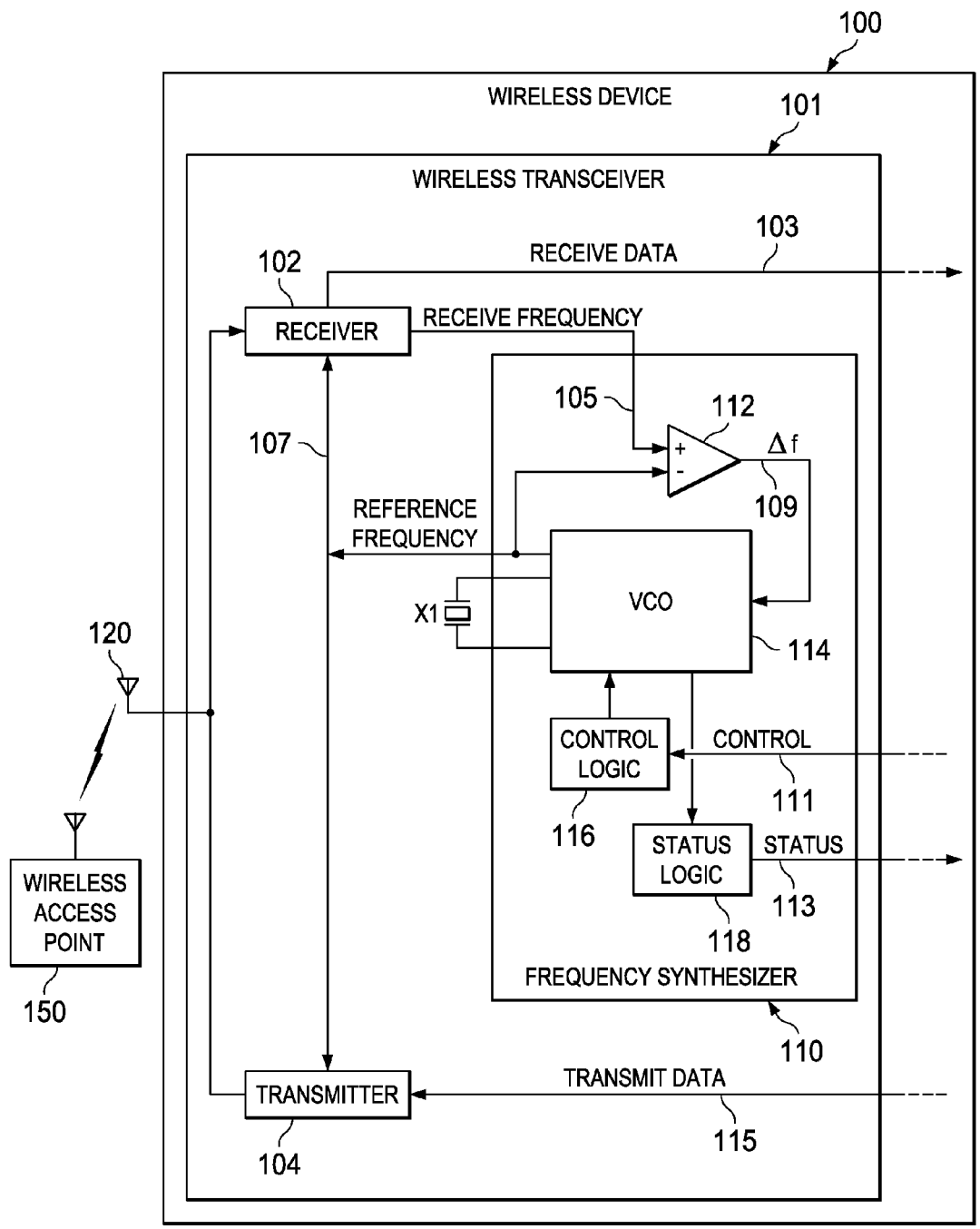
FIG. 1 illustrates a wireless device in accordance with embodiments.

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware and/or software components and may be used to refer to an electronic device, such as a wireless device, a portion of a wireless device, a combination of wireless devices, etc. Further, the term "software" includes any executable code capable of running on a processor, regardless of the media used to store the software. Thus, code stored in non-volatile memory, and sometimes referred to as "embedded firmware," is included within the definition of software.

DETAILED DESCRIPTION

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Embodiments of the disclosure are directed to systems and methods for tracking communication parameters over a plurality of frequency bands. In at least some embodiments, selectively correlated phase-locked loops (PLLs) track carrier frequency offset (CFO) using a common phase error (CPE). The CPE used by each PLL may be selectively weighted based on at least one inter-band frequency correlation (IFC) coefficient. In accordance with embodiments, tracking communication parameters involves a time domain rotator that adjusts the CFO to avoid inter-carrier interference (ICI) and a frequency domain rotator that facilitates convergence of the CFO tracked by the PLLs. The selectively correlated PLLs and the time domain and frequency domain rotators improve the phase and frequency acquisition times in receivers that operate over a plurality of frequency bands (e.g., an Ultra-Wideband (UWB) receiver).

FIG. 1 illustrates a wireless device 100 in accordance with embodiments. In FIG. 1, the wireless device 100 is shown communicating with an access point 150, although other embodiments are possible. Any number of devices may operate as wireless device 100, such as a desktop computer, a laptop computer, a personal digital assistance (PDA), a cellular telephone, and a smart phone, just to name a few examples. The wireless device 100 includes a wireless transceiver 101, which includes a wireless receiver 102 and wireless transmitter 104, both coupled to each other and to antenna 120. Receiver 102 receives wireless radio frequency (RF) signals, via antenna 120, from an external wireless host or network access point (e.g., from wireless access point 150). Receiver 102 generates received data signal 103 by combining reference frequency signal 107 and the received signals. Similarly, transmitter 104 generates and transmits wireless RF signals to wireless access point 150, via antenna 120, by combining reference frequency signal 107 and transmit data signal 115.

Wireless transceiver 101 further includes frequency synthesizer 110, which couples to both receiver 102 and transmitter 104, and includes differential amplifier 112, voltage-controlled oscillator (VCO) 114, reference crystal X1, control logic 116, and status logic 118. The two input nodes of differential amplifier 112 are respectively coupled to an output node of receiver 102 that provides receive frequency signal 105, and an output node of VCO 114 that provides reference frequency signal 107. The output node of differential amplifier 112 couples to an input control node of VCO 114 and provides the frequency difference (Δf) control signal used to adjust the base center frequency of VCO 114 (i.e., the base center frequency of reference frequency signal 107). The base RF center frequency is determined by reference crystal X1, which also couples to VCO 114. The center frequency at which crystal X1 operates is divided and/or multiplied by logic within VCO 114, causing VCO 114 to generate reference frequency signal 107 at a desired center frequency.

Control logic 116 couples to VCO 114 and controls the configuration of VCO 114 that determines the center frequency of the VCO. One or more control signals 111 are sent to control logic 116, and operate to control the center frequency of VCO 114, and thus of frequency synthesizer 110. The overall center frequency is determined by a combination of the programmed center frequency (based upon the known, specified frequency of crystal X1), adjustments that result from frequency differences detected by differential amplifier 112, and frequency offset values used to adjust the programmed center frequency, in accordance with at least some illustrative embodiments as described below. Status logic 118 also couples to VCO 114 and permits status information regarding VCO 114 and frequency synthesizer 110 (via one or more status signals 113) to be provided to components external to frequency synthesizer 110. Control signals 111 and status signals 113 may, for example, be respectively sent and received by processing logic within the device 100. In at least some embodiments, the VCO 114 is controlled using partially correlated PLLs.

Figure 2:
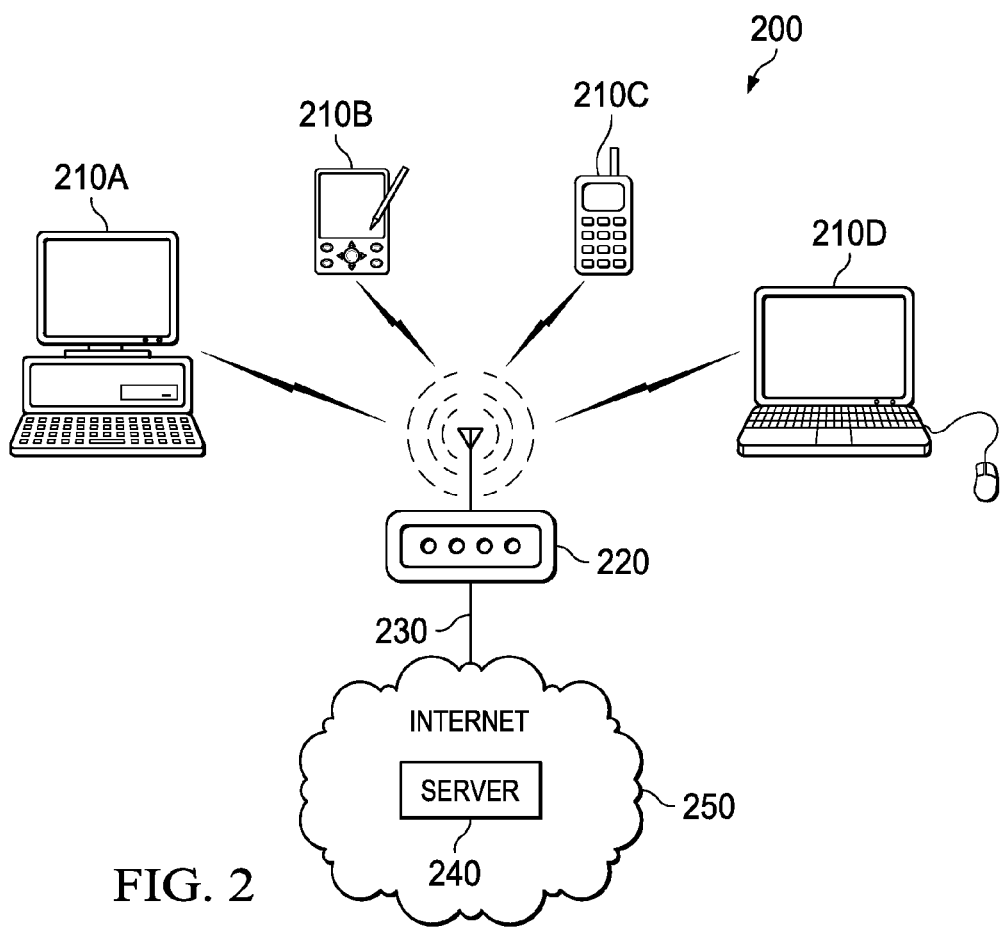
FIG. 2 illustrates a network in accordance with embodiments.

FIG. 2 illustrates a network 200 in accordance with embodiments. To provide wireless data and/or communication services (e.g., telephone services, Internet services, data services, messaging services, instant messaging services, electronic mail (email) services, chat services, video services, audio services, gaming services, etc.), the network 200 comprises an access point (AP) 220 and any of a variety of fixed-location and/or mobile wireless devices or stations (STAs) (referred to individually herein as device, station, STA or device/station), four of which are respectively designated in FIG. 2 with reference numerals 210A, 210B, 210C and 210D. It should be appreciated that the network 200 is meant to be illustrative and not exhaustive. For example, it should be appreciated that more, different or fewer communication systems, devices and/or paths may be used to implement embodiments. Exemplary devices 210 include any variety of personal computer (PC) 210A with wireless communication capabilities, a personal digital assistant (PDA) or MP3 player 210B, a wireless telephone 210C (e.g., a cellular phone, a smart phone, etc.), and a laptop computer 210D with wireless communication capabilities. At least one of AP 220 and STAs 210A-210D are preferably implemented in accordance with at least one wired and/or wireless communication standard (e.g., UWB). Further, at least one device 210 implements one or more functions of the tracking module 310 shown in FIG. 3.

In the example of FIG. 2, to enable the plurality of devices/STAs 210A-210D to communicate with devices and/or servers located outside network 200, AP 220 is communicatively coupled via any of a variety of communication paths 230 to, for example, any of a variety of servers 240 associated with public and/or private network(s) such as the Internet 250. Server 240 may be used to provide, receive and/or deliver services such as data, video, audio, telephone, gaming, Internet, messaging, electronic mail, or other services. Additionally or alternatively, network 200 may be communicatively coupled to any of a variety of public, private and/or enterprise communication network(s), computer(s), workstation(s) and/or server(s) to provide any of a variety of voice service(s), data service(s) and/or communication service(s).

FIG. 3 illustrates a computer system 300 in accordance with embodiments. In at least some embodiments, the computer system 300 is suitable for implementing wireless device 100 of FIG. 1 or the devices 210A-210D of FIG. 2. As shown, the exemplary computer system 300 comprises processor(s) 320. It should be appreciated that processor 320 may be at least one of a variety of processors such as, for example, a microprocessor, a microcontroller, a central processor unit (CPU), a main processing unit (MPU), a digital signal processor (DSP), an advanced reduced instruction set computing (RISC) machine, an (ARM) processor, etc. Processor 320 executes coded instructions 355 which may be present in a main memory of the processor 320 (e.g., within a random-access memory (RAM) 350) and/or within an on-board memory of the processor 320. Processor 320 communicates with memory (including RAM 350 and read-only memory (ROM) 360) via bus 345. RAM 350 may be implemented by dynamic RAM (DRAM), synchronous dynamic RAM (SDRAM), and/or any other type of RAM device. ROM 360 may be implemented by flash memory and/or any other type of memory device.

Processor 320 implements medium access controller (MAC) 330 using one or more of any of a variety of software, firmware, processing thread(s) and/or subroutine(s). MAC 330 provides known MAC functionality and is implemented by executing one or more of a variety of software, firmware, processing thread(s) and/or subroutine(s) with the example processor 320. In at least some embodiments, MAC 330 may be implemented by hardware, software, firmware or a combination thereof, including using an application specific integrated circuit (ASIC), a programmable logic device (PLD), a field programmable logic device (FPLD), discrete logic, or other components.

The computer system 300 also preferably comprises at least one input device 380 (e.g., keyboard, touchpad, buttons, keypad, switches, dials, mouse, track-ball, voice recognizer, card reader, etc.) and at least one output device 385 (e.g., liquid crystal display (LCD), printer, video monitor, touch screen display, a light-emitting diode (LED), etc.)—each of which are communicatively connected to interface 370.

As shown, interface 370 also communicatively couples a wireless transceiver 302 and radio frequency (RF) antenna 355 to the processor 320 and/or MAC 330. The RF antenna 355 and wireless transceiver 302 support any of a variety of wireless signals, wireless protocols and/or wireless communications (e.g., UWB). RF antenna 355 and wireless transceiver 302 are able to receive, demodulate and decode signals transmitted in a wireless network. Likewise, wireless transceiver 302 and RF antenna 355 are able to encode, modulate and transmit wireless signals from computer system 300 to other devices of a wireless network. In some embodiments, RF antenna 355 and transceiver 302 correspond to the "physical layer" (PHY) of the computer system 300. In accordance with embodiments, the wireless transceiver 302 comprises a tracking module 310 for tracking communication parameters such as phase error, carrier frequency offset (CFO), sampling frequency offset (SFO) and/or other communication parameters. The tracking module 310 also may report a link quality indicator (LQI).

As shown, the tracking module 310 comprises a phase error sub-module 312, a CFO sub-module 314, a SFO sub-module 316, and a LQI sub-module 318. In accordance with embodiments, the phase error sub-module 312 estimates the CPE using selectively correlated PLLs. Additionally or alternatively, the phase error sub-module 312 estimates phase slope across pilot tones in the frequency domain.

The CFO sub-module 314 derives a frequency error from the estimated CPE and provides feedback to rotators in the time domain and the frequency domain. The time domain rotator adjusts the CFO before a Fast Fourier Transform (FFT) is performed on a received signal to avoid inter-carrier interference (ICI). The frequency domain rotator facilitates convergence of the CFO estimate after the FFT is performed.

The SFO sub-module 316 derives a timing error from the estimated phase slope and provides feedback to rotators in the time domain and the frequency domain. In at least some embodiments, the SFO sub-module 316 averages the phase slope over a configurable number of symbols (e.g., 5 symbols) before making a correction. As needed, the SFO sub-module 316 performs a stuff/stealing operation in the time domain to maintain optimal Fast Fourier Transform (FFT) placement and channel correction. The LQI sub-module 318 estimates a signal-to-noise ratio (SNR) and reports an estimate link quality based on the SNR.

Figure 4:
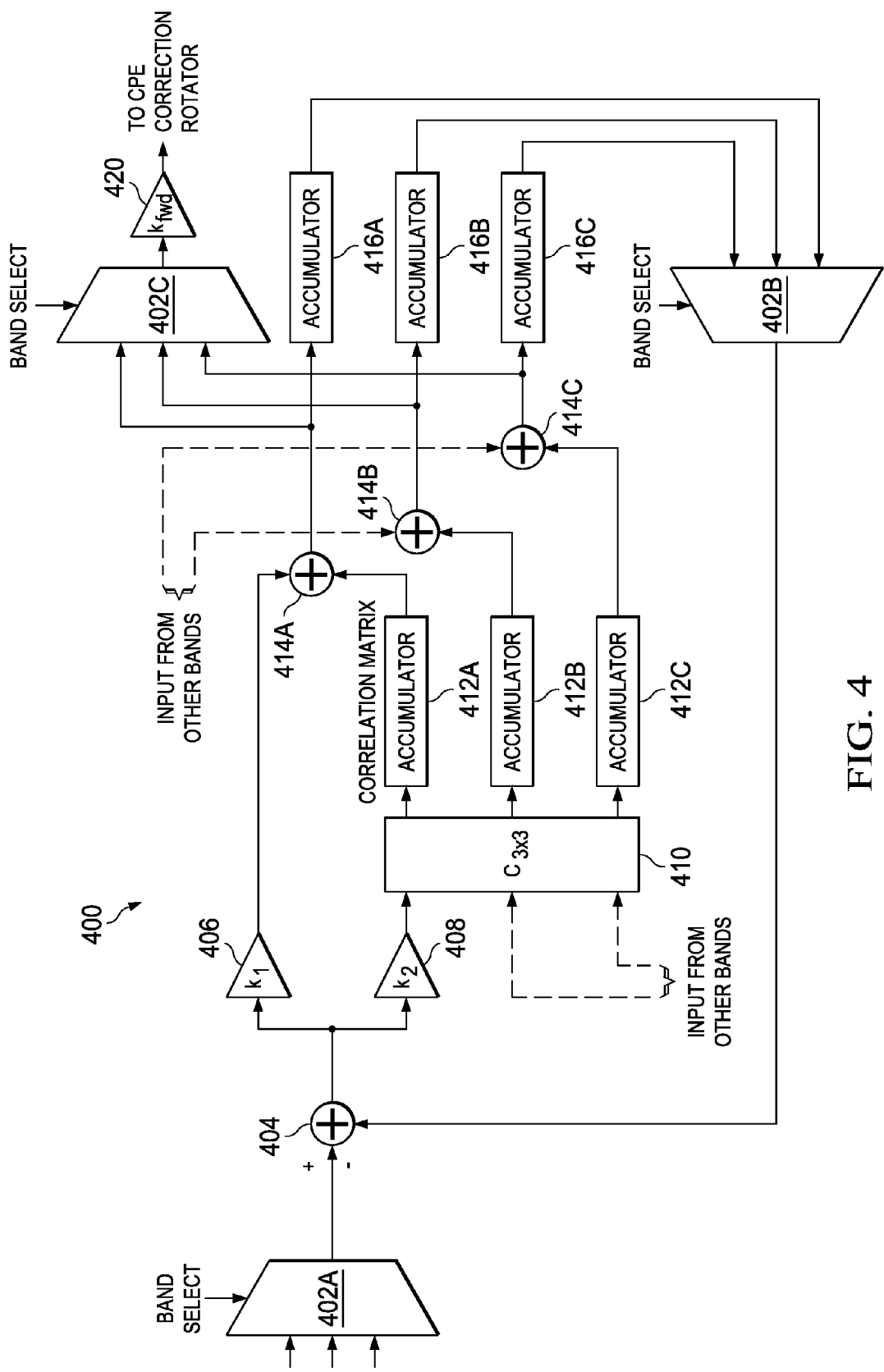
FIG. 4 illustrates carrier frequency offset (CFO) tracking logic in accordance with embodiments.

FIG. 4 illustrates CPE tracking logic 400 in accordance with embodiments. As shown, the CPE tracking logic 400 comprises various multiplexers 402A-402C that receive a control signal ("Band Select") and select a frequency band accordingly. The CPE estimate for a selected band is forwarded by multiplexer 402A to a rotator 404, which represents time domain and frequency domain rotation in FIG. 4. The rotated CPE estimate is weighted at blocks 406 and 408 by the weights "$k_1$" and "$k_2$". As desired, the rotated CPE estimates can also be weighted by at least one interband error correlation (IEC) coefficient at block 410. In accordance with some embodiments, block 410 represents a matrix having IEC coefficients for weighting the rotated CPE estimate. In accordance with embodiments, IEC coefficients vary based on data rate, hop sequence, noise levels for the plurality of frequency bands and/or signal-to-noise ratio (SNR) levels for the plurality of frequency bands.

After block 410, accumulators 412A-412C and adders 414A-414C accumulate and add the various weighted values for the selected frequency band as well as other frequency bands. The multiplexer 402C selects one of the outputs of the adders 414A-414C to forward to the CPE correction rotator 420. As shown, another weight ("$k_{fwd}$") can be applied between the multiplexer 402C and the CPE correction rotator. The outputs of the adders 414A-414C are also forwarded to accumulators 416A-416C as part of a feedback loop to the rotator 404. The multiplexer 402B selects which of the outputs from the accumulators 416A-416 to provide to the rotator 404. In at least some embodiments, the tracking module 310 of FIG. 3 implements at least some of the CPE tracking logic 400 of FIG. 4.

Figure 5:
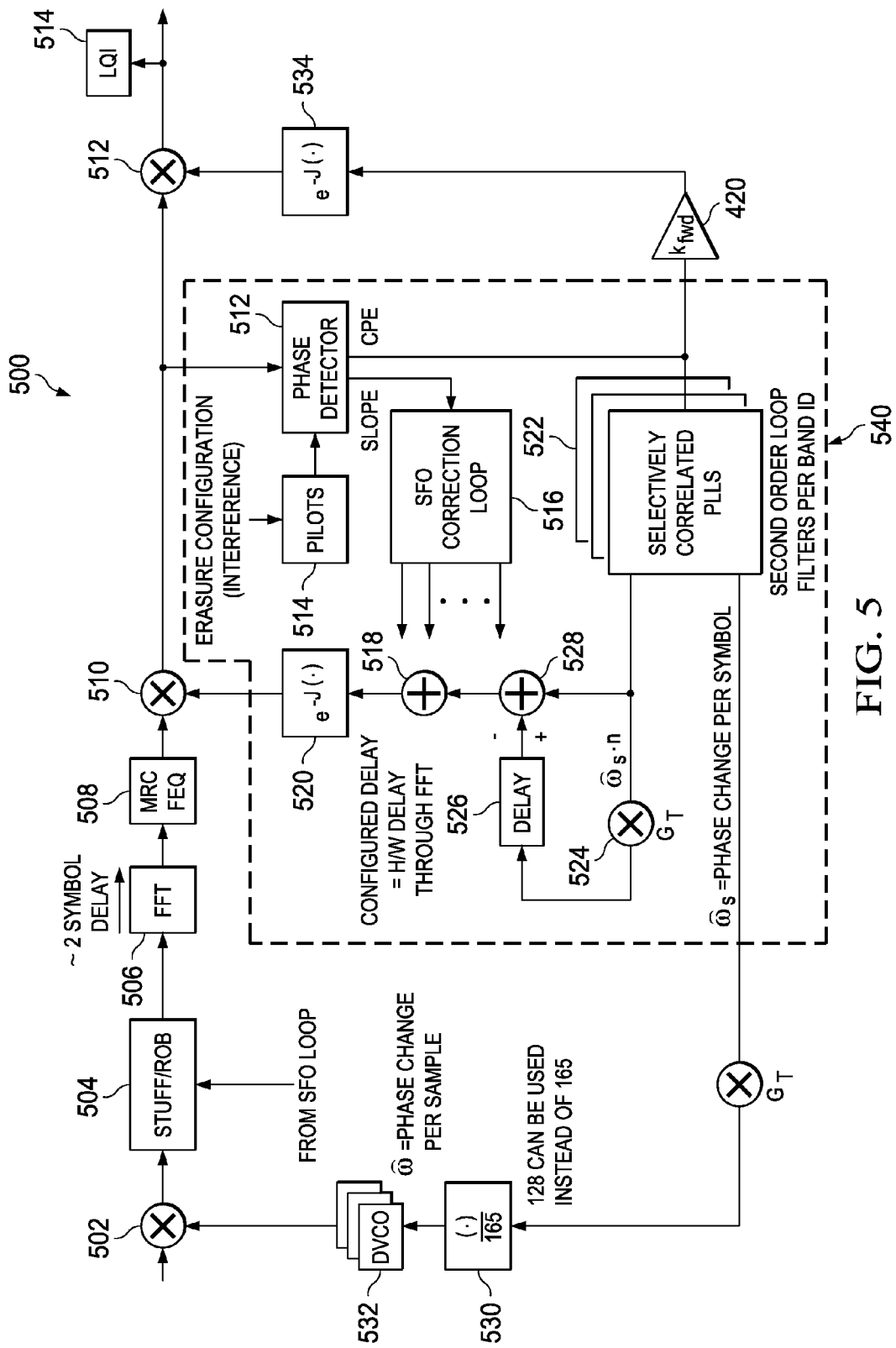
FIG. 5 illustrates tracking module logic in accordance with embodiments.

FIG. 5 illustrates tracking module logic 500 in accordance with embodiments. As shown, the tracking module logic 500 comprises a time domain rotator 502 coupled to a stuff/rob block 504. The stuff/rob block 504 also receives input from an SFO loop. The output of the stuff/rob block 504 is input to an FFT block 506, which converts the time domain signal to frequency domain at which point a maximum ratio combiner (MRC) block 508 operates on the received signal. The output of the MRC block 508 is provided to a frequency domain rotator 510. The rotator 510 also receives input from a feedback loop 540.

As shown, the feedback loop 540 comprises a phase detector 512 that detects the phase of the received signal (from the rotator 510) based on pilots 514. The phase detector 512 outputs an estimated CPE to selectively correlated PLLs 522. The phase detector 512 also outputs a slope estimation to SFO correction loop 516 where a phase correction is calculated for each OFDM tone. There are two outputs of the correlated PLLs 522. The first output feeds the time domain rotator 502 and the second output feeds the frequency domain rotator 510. The feedback to the time domain is fed to a normalization block 530 which translates the phase correction per symbol to a phase correction per sample. The output of the normalization block 530 is fed to traditional digital voltage controlled oscillators (DVCOs) for each band ID and then is fed to the time-domain rotator 502 where each sample is rotated in phase in the appropriate manner. Since there is an approximate 2 symbol delay through the FFT block 506 the rotation by the time domain rotator 502 occurs before the rotation by the frequency domain rotator 510. To decouple these two rotation functions, the phase correction applied in the time domain is estimated and subtracted from the frequency domain correction. This is accomplished by multiplying the output of the selectively correlated PLLs 522 by the same feedback constant 524 and then delaying this output by block 526. The output of 526 is then subtracted 528 from the current phase estimate. The output of block 528 is added by adder 518 to the SFO correction loop 516 output which represents the appropriate phase rotation per OFDM tone and is then fed into block 520 which translates a phase into a complex number. The output of block 520 is then fed to the frequency domain rotator 510 where each tone is phase corrected. In at least some embodiments, the tracking module 310 of FIG. 3 implements at least some of the tracking module logic 500 of FIG. 5.

Figure 6:
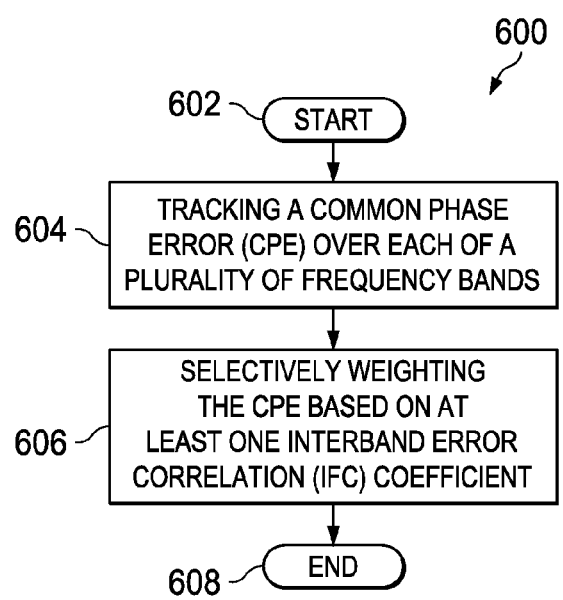
FIG. 6 illustrates a method in accordance with embodiments.

FIG. 6 illustrates a method 600 in accordance with embodiments. After starting at block 602, the method 600 tracks a CPE over a plurality of frequency bands (block 604). The CPE is selectively weighted based on at least one IFC coefficient (block 606) and the method ends (block 608). In at least some embodiments, weighting the CPE based on at least one IFC coefficient involves a matrix multiplication. The IFC coefficients may vary based on data rate, hop sequence, noise levels for the plurality of frequency bands and/or SNR levels for the plurality of frequency bands.

In at least some embodiments, the method 600 also involves performing a time domain rotation that adjusts a carrier frequency offset (CFO) to avoid inter-carrier interference (ICI) and performing a frequency domain rotation that facilitates convergence of CPE estimates being tracked. Further, the method 600 may also involve applying a time domain frequency correction before performing the frequency domain rotation. Further, the method 600 may also involve averaging a sampling frequency offset (SFO) over a configurable number of symbols and correcting a sampling frequency based on the averaged SFO.

Figure 7:
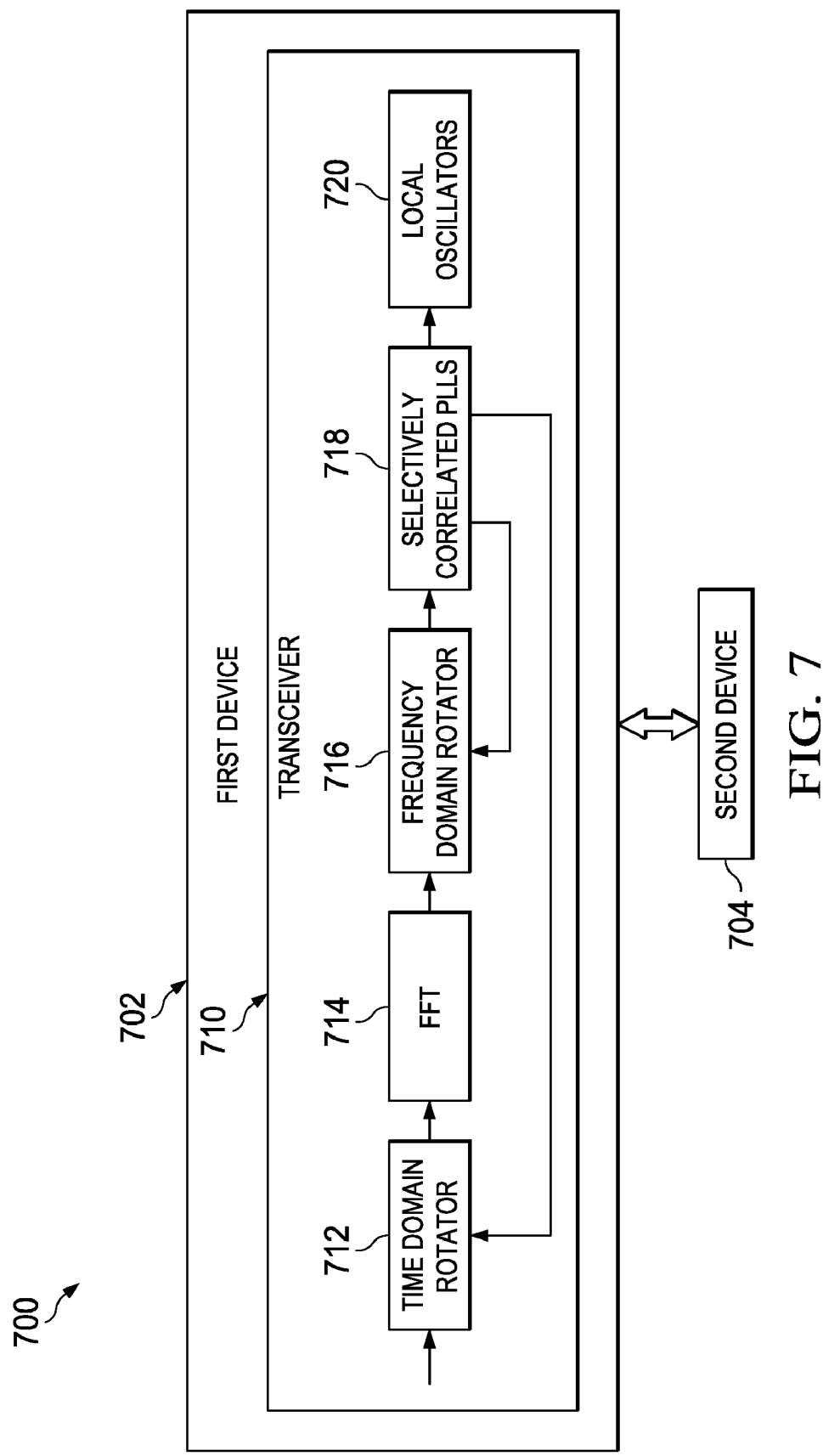
FIG. 7 illustrates a wireless network in accordance with embodiments.

FIG. 7 illustrates a wireless network 700 in accordance with embodiments. The wireless network 700 comprises at least a first device 702 and a second device 704 in communication with each other. In at least some embodiments, the wireless network 700 corresponds to an Ultra-Wideband (UWB) network. Although the description of FIG. 7 focuses on the first device 702, it should be understood that the second device 704 may comprise similar components.

As shown, the first device 702 comprises a transceiver 710 for communicating with other devices (e.g., the second device 704). The transceiver 710 implements selectively correlated PLLs 718 to track a carrier frequency offset (CFO) using a CPE over a plurality of frequency bands. In at least some embodiments, the CPE is selectively weighted based on at least one inter-band frequency correlation (IFC) coefficient.

The PLLs 718 control a plurality of local oscillators 720 (e.g., each local oscillator is controlled by a separate PLL).

The transceiver 710 also implements a time domain rotator 712 that adjusts the CFO to avoid inter-carrier interference (ICI) as well as a frequency domain rotator 716 that facilitates convergence of CFO estimates tracked by the PLLs 718. As shown, FFT logic 714 is located between the time domain rotator 712 and the frequency domain rotator 716. In accordance with at least some embodiments, the devices 702 and 704 in FIG. 7 correspond to the device 100 of FIG. 1 or the computer system 300 of FIG. 3. Further, in some embodiments, the transceiver 710 and transceiver components described for FIG. 7 may correspond to or implement the components described for FIGS. 4-5.

The above disclosure is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A communication system, comprising:
   a receiver having a local oscillator (LO) for each of a plurality of frequency bands, each LO being controlled by a separate phase-locked loop (PLL) that tracks carrier frequency offset (CFO) using a common phase error (CPE),
   wherein the CPE is selectively weighted based on at least one inter-band frequency correlation (IFC) coefficient.

2. The communication system of claim 1 wherein the at least one IFC coefficient comprises a matrix.

3. The communication system of claim 1 wherein the at least one IFC coefficient varies based on data rate.

4. The communication system of claim 1 wherein the at least one IFC coefficient varies based on a hop sequence.

5. The communication system of claim 1 wherein the at least one IFC coefficient varies based on noise levels for the plurality of frequency bands.

6. The communication system of claim 1 wherein the at least one IFC coefficient varies based on signal-to-noise ratio (SNR) levels for the plurality of frequency bands.

7. The communication system of claim 1 wherein the receiver further comprises,
   Fast Fourier Transform (FFT) logic;
   a time domain rotator before the FFT logic that adjusts a carrier frequency offset (CFO) to avoid inter-carrier interference (ICI); and
   a frequency domain rotator after the FFT logic that facilitates convergence of CPE estimates tracked by the PLLs.

8. The communication system of claim 7 wherein a time domain frequency correction is applied before the frequency domain rotator.

9. The communication system of claim 1 wherein the receiver comprises a sampling frequency offset (SFO) loop that averages the SFO over a configurable number of symbols before a sampling frequency correction based on the averaged SFO is performed.

10. A method, comprising:
    tracking a carrier frequency offset (CFO) based on a common phase error (CPE) for each of a plurality of frequency bands; and
    selectively weighting the CPE based on at least one inter-band frequency correlation (IFC) coefficient.

11. The method of claim 10 wherein weighting the CPE based on at least one IFC coefficient comprises performing a matrix multiplication.

12. The method of claim 10 further comprising varying the at least one IFC coefficient based on data rate.

13. The method of claim 10 further comprising varying the at least one IFC coefficient based on a hop sequence.

14. The method of claim 10 further comprising varying the at least one IFC coefficient based on noise levels for the plurality of frequency bands.

15. The method of claim 10 further comprising varying the at least one IFC coefficient based on signal-to-noise ratio (SNR) levels for the plurality of frequency bands.

16. The method of claim 10 further comprising,
    performing a time domain rotation that adjusts the CFO to avoid inter-carrier interference (ICI); and
    performing a frequency domain rotation that facilitates convergence of CFO estimates being tracked.

17. The method of claim 16 further comprising applying a time domain frequency correction before performing the frequency domain rotation.

18. The method of claim 10 further comprising averaging a sampling frequency offset (SFO) over a configurable number of symbols and correcting a sampling frequency based on the averaged SFO.

19. An Ultra-Wideband (UWB) network, comprising:
    a first device; and
    a second device,
    wherein at least one of the first and second devices implements selectively correlated phase-locked loops (PLLs) to track a carrier frequency offset (CFO) over a plurality of frequency bands and
    a time domain rotator that adjusts the CFO to avoid inter-carrier interference (ICI) and a frequency domain rotator that facilitates convergence of CFO estimates tracked by the PLLs.

* * * * *